(12) United States Patent
Vissing et al.

(10) Patent No.: US 11,286,392 B2
(45) Date of Patent: Mar. 29, 2022

(54) SOLID PLASMA POLYMER BODY

(71) Applicant: FRAUNHOFER-GESELLSCHAFT ZUR FORDERUNG DER ANGEWANDTEN FORSCHUNG E.V., Munich (DE)

(72) Inventors: Klaus-Dieter Vissing, Thedinghausen (DE); Matthias Ott, Dohren (DE); Gregor Grassl, Stade (DE); Wolfgang Hielscher, Bremen (DE)

(73) Assignee: Fraunhofer-Gesellschaft Zur Förderung Der Angewandten Forschung E.V., Munich (DE)

( * ) Notice: Subject to any disclaimer, the term of this patent is extended or adjusted under 35 U.S.C. 154(b) by 556 days.

(21) Appl. No.: 15/024,742

(22) PCT Filed: Sep. 25, 2014

(86) PCT No.: PCT/EP2014/070449
§ 371 (c)(1),
(2) Date: Mar. 24, 2016

(87) PCT Pub. No.: WO2015/044247
PCT Pub. Date: Apr. 2, 2015

(65) Prior Publication Data
US 2016/0244618 A1 Aug. 25, 2016

(30) Foreign Application Priority Data

Sep. 25, 2013 (DE) .......................... 102013219331.9
Sep. 25, 2013 (DE) .......................... 102013219337.8

(51) Int. Cl.
| | |
|---|---|
| *C09D 5/08* | (2006.01) |
| *B05D 7/14* | (2006.01) |
| *C09D 183/04* | (2006.01) |
| *C23C 16/50* | (2006.01) |
| *B05D 1/00* | (2006.01) |
| *B05D 5/08* | (2006.01) |

(52) U.S. Cl.
CPC ................. *C09D 5/08* (2013.01); *B05D 1/62* (2013.01); *B05D 7/14* (2013.01); *C09D 183/04* (2013.01); *C23C 16/50* (2013.01); *B05D 5/08* (2013.01); *B05D 2518/10* (2013.01)

(58) Field of Classification Search
CPC .......... C09D 5/08; C09D 183/04; B05D 1/62; B05D 7/14; B05D 5/08; B05D 2518/10; C23C 16/50
USPC ....................................................... 428/457
See application file for complete search history.

(56) References Cited

U.S. PATENT DOCUMENTS 7,622,400 B1   11/2009   Fox et al.

FOREIGN PATENT DOCUMENTS

| DE | 10 2005 059706 A1 | 6/2007 |
| DE | 10 2009 000699 A1 | 8/2010 |
| DE | 102009000699 | * 8/2010 |
| EP | 1 301 286 B1 | 4/2004 |
| JP | 2006-074048 A | 3/2006 |
| WO | WO 2010/125178 A1 | 11/2010 |
| WO | WO2010125178 | * 11/2010 |

OTHER PUBLICATIONS

Japanese Office Action dated May 14, 2018 in related Japanese Patent Application No. 2016-517504.

* cited by examiner

*Primary Examiner* — Ling Siu Choi
*Assistant Examiner* — Ronald Grinsted
(74) *Attorney, Agent, or Firm* — Preti Flaherty Beliveau & Pachios LLP

(57) ABSTRACT

The invention relates to a solid plasma polymer body, especially a plasma polymer layer, which has an exceptionally high modulus of elasticity at a given C/O ratio. It further relates to a solid body comprising a substrate and, applied to this substrate, a plasma polymer layer of the invention.

51 Claims, 6 Drawing Sheets

SOLID PLASMA POLYMER BODY

The invention relates to a solid plasma polymer body, especially a plasma polymer layer, which has an exceptionally high modulus of elasticity at a given C/O ratio. It further relates to a solid body comprising a substrate and, applied to this substrate, a plasma polymer layer of the invention, and to the use of a plasma polymer layer as separating layer in a shaping mold and also to the use of a layer of the invention for improving the cleanability of a solid body with water or other cleaning media. It further relates to the use of a plasma polymer layer as anticorrosive on a metal or metal alloy substrate and also to the use of a layer of the invention for improving the cleanability of a solid body having metal on its surface with water or other cleaning media.

For industrial applications, but also in the domestic sector, there is a constant need for optimized surfaces for a multitude of purposes. The properties that are to be optimized are of course always dependent on the end use: for instance, the particular end use determines which ranges for parameters, for example hardness, extensibility and/or surface energy, are particularly desirable. In many cases, it is particularly demanding to achieve improvements for the parameters mentioned and optionally further parameters without any deterioration, or at least any excessive deterioration, in another (important) parameter from the point of view of the end use.

Particularly high demands, especially also on the aforementioned parameters, exist for shaping methods for fiber-reinforced plastics in demolding. This is important for a first aspect of the present invention.

Fiber-reinforced plastics (FRPs) consist of matrix-bound fibers which may have a layered configuration. The fibers may be oriented, unoriented or woven. In addition, the fibers may consist of different materials, for instance glass fibers, carbon fibers, aramid fibers, boron fibers, natural fibers or wood. The individual layers may consist of different materials. For instance, also suitable for formation of fiber composite materials are metal fabrics, foams, and three-dimensional structure plates, for instance honeycombs or wood. The matrix typically consists of a thermoplastic or a reactive resin which can be thermally hardened. Reactive resins are, for instance, polyester, vinyl ester or epoxy resins, melamine or phenol-formaldehyde resins.

The best-known methods of producing fiber-reinforced plastics are manual lamination, (vacuum) infusion methods, prepreg methods, fiber winding, fiber spraying, injection molding, injection methods such as resin transfer molding (RTM), wet pressing methods, for example for production of sheet molding compounds (SMCs) or with the aid of thermoplastic organosheets.

Typically, FRP components are produced on at least one side of a mold. In order that the component can be detached from the mold after the manufacturing process, it is predominantly the case nowadays that separating agents are applied to the mold surface prior to the manufacturing. According to the manufacturing method, it is customary to subsequently apply preimpregnated fibers e.g. prepregs, dry fibers, peel plies, other auxiliary materials (such as impregnated copper grid as flash protection) or else in-mold lacquers (IMC, in-mold coating) to the mold. In the dry fiber methods, in a further step, the matrix resin is supplied in liquid form. At the end, in the case of thermoset FRP, the matrix resin is hardened, frequently with heating of the mold. In the case of thermoplastic FRPs, the polymer is likewise heated in order to achieve forming or shaping.

A typical application of an IMC lacquer is application in the form of a gelcoat, for example manually with the aid of a roller. The IMC lacquer is typically first partly hardened, then the standard FRP buildup is undertaken, and only in the course of hardening of the matrix resin does the IMC lacquer gain its final hardness.

After the hardening, or forming or primary shaping, the workpiece is demolded with the aid of the separating agents applied beforehand. In this way, it is possible, for example, to produce parts for gliders, rotor blades for wind turbines, boat hulls, car parts, pipes, swimming pools and many other items.

In all these processes, it is of great significance and indispensable to treat the full surface of the mold with a separating agent prior to contact with the first gelcoat or resin layer in order to enable fault-free and simple demolding of the workpiece. After the demolding, the separating agents remain both on the plastic molding and on the mold surface. As a result, the moldings and the molds frequently have to be freed of the separating agent residues in a laborious manner. Moreover, the moldings are in some cases joined by adhesives and/or painted, which entails an effective and therefore very laborious removal of separating agents and seamless quality assurance.

For many years, there have therefore been efforts to eliminate separating agents from the production of moldings from plastic, since separating agent-free production is more effective, less expensive, cleaner and more environmentally friendly. But the developers and inventors are confronted by major problems which have to date made rapid and widespread implementation of this objective impossible. These include the different plastics to be demolded with their respective additives, and their different hardening reactions and processing conditions.

In addition, this situation is complicated both by the use of a multitude of entirely different manufacturing methods in order to manufacture components of a wide variety of different shapes and by the fact that, for economic reasons, demolding in many cases should precede the complete hardening of the product.

Separating agents are used primarily for production of moldings from reactive plastics. These include components made from polyurethane (PUR), epoxy resins (EP), phenol-formaldehyde resins, polyester resins, ABS resins, melamine resins, polyamide resins, vinyl ester resins, alkyd resins, silicones or further potting compounds. In addition, separating agents are utilized in isolated production methods for thermoplastic components, for example organosheets. By contrast with the reactive plastics, they serve merely to reduce physical interaction forces (e.g. van der Waals forces, hydrogen bonds).

Irrespective of the plastic used, and also irrespective of whether the separating agent has been supplied externally or as an internal separating agent, it is a feature of the method that there will be cohesive fracture within the separating agent on demolding. This is the reason for the drawbacks that a separating agent can entail.

Therefore, it is not a viable solution to combine a separating agent with a demolding layer. This merely facilitates mold cleaning.

All the technical approaches to consistently dispensing with separating agents can in principle be divided into two categories:
  1 Insert methodology, in which films or injection-molded inserts are placed into the mold.

2. Mold coating methodology, in which there is a direct, firmly adhering coating of the mold with a separating layer.

Typical Insert Methodologies are:

foam and film methodology from Canon
PURe liners from Frimo (see also DE 10 2009 054 893 A1)
film inserts made from fluoropolymers (e.g. ETFE, PTFE)
Flex$^{PLAS}$ plasma polymer-coated films (DE 10 2012 207 149.0) from FhG Typical Mold Coating Methodologies:

fluoropolymer coatings (such as polytetrafluoroethylene PTFE)
plasma polymer coatings coated by low-pressure plasma methodology (e.g. EP 0 841 140 A2 or Acmos/FhG DE 10 034 737 A1 or FhG DE 10 2006 018 491 A1) or atmospheric pressure plasma methodology (FhG DE 10 2005 059 706 A1)
Sicon (Fraunhofer IST) (DLC coatings)
PlascoSAM (JE Plasma Consult GmbH) (DLC coatings)

With regard to organosilicon plasma polymer coatings, there are additionally a multitude of further publications. For example:

DE 101 31 156 A1 (FhG, article with plasma polymer coating and method of production thereof)
DE 10 2009 002 780 A1 (FhG, metal substrates with scratch-resistant and extensible anticorrosion layer and method of production thereof)
DE 10 2007 000 611 A1 (FhG, scratch-resistant and extensible corrosion layer for lightweight metal substrates)

EP 0 841 140 A2 gives only general pointers relating to production of plasma polymer separation layers without any more detailed description of the layers to be used. Merely illustrative figures are given for the water contact angle and for the total surface energy. In addition, there is no pointer as to how the coating procedure described for a 21 L plasma reactor has to be altered to coat plastic molds having much greater dimensions than the 1.3×1.2×22 cm described.

DE 10 034 737 A1 discloses a method of producing a permanent demolding layer by plasma polymerization on the surface of a mold, in which a gradient layer structure in the demolding layer is produced by variation of the polymerization conditions with time. No exact description of the composition or the structure of the plasma polymer separation layer is given. However, illustrative implementation instructions are given for the coating of plastic molds in a 355 L plasma reactor. It is additionally mentioned that, through a suitable selection and variation of the parameters with time, for example in the case of the polymerization of organosilicon compounds, it is possible to achieve continuous application of the inorganic network (glass-like) directly on the mold surface and of the organic network atop the inorganic network. This achieves optimal adhesion to the substrate and an optimal permanent separation effect with respect to the molding (for example by virtue of a high proportion of $CH_3$ and/or $CF_3$ groups in the surface). The change from the glass-like network to a separating coating is achieved by the reduction in the proportion of oxygen.

DE 10 2005 059 706 A1 describes a method of producing a plasma polymer separation layer on a substrate surface, wherein a plasma polymer is formed on the substrate surface at atmospheric pressure under polymerization conditions that are constant with time. With regard to the separation layer, details are given as to the chemical composition by XPS analysis, but there are no figures for macroscopic properties such as hardness or modulus of elasticity.

DE 10 2006 018 491 A1 and WO 2007/118905 A1 [Flexible plasma polymer products, corresponding articles, production methods and use] disclose an article comprising or consisting of a plasma polymer product, consisting of carbon, silicon, oxygen and hydrogen, with or without standard impurities, wherein, in the ESCA spectrum of the plasma polymer product, with calibration to the aliphatic component of the C 1s peak at 285.00 eV, in comparison with a trimethylsiloxy-terminated polydimethylsiloxane (PDMS) with a kinematic viscosity of 350 mm$^2$/s at 25° C. and a density of 0.97 g/mL at 25° C., the Si 2p peak has a bond energy shifted by not more than 0.44 eV to higher or lower bond energies, and the O 1s peak has a bond energy shifted by not more than 0.50 eV to higher or lower bond energies.

It is mentioned that, because of the extensibility of this plasma polymer coating, flexible products such as films (especially extensible films) can be provided with an appropriate anti-adhesion or easy-to-clean surface. It is additionally mentioned that this plasma polymer coating can be used as a separation layer or part of a separation layer on a mold surface.

This plasma polymer coating is a soft coating having elastomer-like mechanical properties. It exhibits a very good and lasting separating effect with respect to some polyurethane foams.

Typically, organosilicon plasma polymer separation layers for PUR according to the prior art regularly have the following properties:
nanohardness: <0.15 GPa
modulus of elasticity, measured with a nanoindenter: <1.25 GPa, Coatings which have been produced according to DE 10 2006 018 491 A1, according to DE 10 2005 059 706 A1 or by a method based on DE 10 034 737 A1 also exhibited good separation properties with respect to an epoxy-based CFRP matrix. For example, in an RTM method, the epoxy-based resin HexFlow® RTM6 from Hexel was injected at a pressure of 8 bar into the closed mold filled with a carbon fiber fabric and hardened at 180° C. for 90 minutes. Subsequently, problem-free removal of the cured CFRP component was possible without the use of internal or external separating agents. However, these coatings exhibited too low a mechanical stability from an economic point of view. After not more than 30 demoldings, the separation properties had declined to such a degree that opening of the mold was possible only with high expenditure of force. Studies showed that the coating had been locally destroyed by the fibers.

In addition, the mechanical characteristics such as the hardness or modulus of elasticity of these coatings were measured with the aid of nanoindentation. It was found that the hardness was not more than 0.2 GPa and the modulus of elasticity not more than 2.0 GPa.

DE 101 31 156 A1 describes an article comprising a substrate and a plasma polymer coating comprising oxygen, carbon and silicon which has been bonded to the substrate over the full surface, where the molar ratios in the plasma polymer coating on the side facing away from the substrate are as follows:

$$1.1{:}1 < n(O){:}n(Si) < 2.6{:}1$$

$$0.6{:}1 < n(C){:}n(Si) < 2.2{:}1.$$

However, no pointer is given here to utilization of these coatings as separation layers for demolding of plastic components. Nor are any figures given for macroscopic properties such as hardness or modulus of elasticity. Indeed, these properties are yet to be optimized for separation methods.

DE 10 2007 000 611 A1 describes a coated lightweight metal substrate,
wherein the coating has
a proportion of carbon determinable by means of XPS of 5 to 20 atom %, preferably 10 to 15 atom %, based on the total number of carbon, silicon and oxygen atoms present in the coating,
a yellow index determined in accordance with ASTM D 1925 of ≤3, preferably ≤2.5, and
a hardness, measurable by means of nanoindentation, in the range from 2.5 to 6 GPa, preferably 3.1 to 6 GPa.

Here too, no pointer is given to utilization of these coatings as separation layers for demolding of plastic components; the layers disclosed, with regard to their crucial window of properties, are still in need of improvement in relation to use as mold layers.

A similar layer is described in DE 10 2009 002 780 A1.

DE 10 2005 014 617 A1 discloses a mold for casting lenses made from plastic, having a cavity bounded by surfaces and having means of introducing the plastic into the cavity, the surfaces having been provided with a coating, characterized in that the coating has an electrical conductivity of less than 1 Ωcm. As an example of the coatings, ternary compounds containing C, Si, O are mentioned. There is no pointer to coatings having hydrogen-containing organic groups.

US 2010/239783 A1 describes a method of producing a working mold having a plasma polymer coating. The layers described therein have a nanohardness of <0.15 GPa, and a modulus of elasticity, measured with a nanoindenter, of <1.25 GPa.

It has been found that good plasma polymer separation layers for PUR foams are not the most suitable plasma polymer separation layers for fiber composite plastics (FRPs). Instead, it has been found that much harder layers are required for good and lasting separation properties with respect to FRPs than for separation with respect to PUR foams. By contrast, the chemical composition of the near-surface regions of the plasma polymer coating can be varied much more significantly without losing the good separation properties.

The direct coating of molds with a separation layer which enables separation agent-free manufacture is of great interest particularly for the production of smaller components having an extent of not more than a few meters. In this context, the question of the longevity of the separation effect and hence of elevated mechanical stability plays a major role, since only maximum "permanence" of the separation effect enables the desired economic benefit. This is especially true when the availability of the mold—for example since it has to be deinstalled and transported to a low-pressure plasma reactor—is distinctly limited because of the coating.

In contrast to the production of PUR moldings, what are used in the production of fiber composite moldings, especially of CFRP and GFRP components, are, for example, epoxy resins which are frequently hardened at high temperatures (120°-190° C.) to give a hard and rigid body. The effect of this is that the reactive resin has very good crosslinking in the region of the interphase at the interface to the separation layer, in contrast with PUR production, and has become part of the solid body. This makes a fracture in the interphase less likely—the demands on the separation performance of the separation layer drop slightly.

On the other hand, however, demands on other properties become prominent. These include especially the hardness and durability of the separation layer and its ability to develop both low friction and a low breakaway torque from the component formed. These properties are necessary for the separating operation itself and also for the longevity of the separating effect; otherwise, full-area and/or local defects (and a decreasing separation performance) are to be expected. Moreover, they are important for a simple and effective demolding process.

In this connection, it should be pointed out that a good separating effect is the basic prerequisite for a successful demolding process, but is not the sufficient condition. A demolding process for a separating agent-free demolding necessarily requires the possibility of separability of mold or coated mold and workpiece in the manner of a peeling movement. The manner of lifting off a mold lid vertically, which is utilized in many cases nowadays, is inappropriate for demolding in terms of a separation layer having a long-lasting effect.

A high mechanical stability of the separation layer is sought after, for example, when hard dry fiber materials are being processed and a closed mold which presses the fibers together is being used for the purpose. In such an apparatus, the fibers, especially undulations, are pressed locally with high force onto the coated mold surface. Small defect sites arise in the plasma polymer separation layer according to DE 10034737, which gradually grow three-dimensionally and lower the separation performance.

In this connection, in-house studies have shown that the above-described separation layer which has been optimized for the highest separation performances with respect to PUR is too soft. It has a nanohardness in the range of 0.005-0.015 GPa and a modulus of elasticity in the range from 0.7 to 1.25 GPa.

In accordance with the layer structure in DE 10034737 (example 3), the suggestion is made to the person skilled in the art to make the plasma polymer separation layer harder by increasing the proportion of oxygen during the coating operation and hence departing from the gas mixing ratios proposed. Regrettably, this simultaneously increases the surface energy and especially the polar component of surface energy of the separation layer; the separation properties decline distinctly and rapidly.

In addition, it has been found in practice that certain components, for example a cylindrical ring, can be demolded only with a demolding chamfer. The component shrinks onto the inner core as a result of the crosslinking reactions within the matrix and the cooling after the opening of the mold. For detachment, in that case, both a demolding chamfer and a durable separation layer surface with favorable friction properties are needed. A low breakaway torque in particular facilitates the separating operation, as does a high modulus of elasticity of the coating.

Accordingly, plasma polymer separation layers that on the one hand are much harder than layers according to the prior art but at the same time have very low surface energies with a low polar component and/or a low friction value and a low breakaway torque are desirable.

What is common to the layers from the prior art is that they are in need of improvement for use in the separation methods in plastics processing, especially in the separation methods with respect to fiber composite materials. In this context, both the properties of separability (adhesive fracture between layer and component) and service life in the processing methods are of significance. In this context, a good service life in many fields of application can be achieved only through a suitable profile of properties in the combination of hardness, flexibility and separation performance.

A second aspect of the invention is corrosion protection. Corrosion protection is an important technical problem, since corrosion destroys wealth and causes machine downtime. Therefore, there exist a wide variety of different methods of rendering surfaces corrosion-inhibiting. These include passive anticorrosion layers through painting or the use of electrolytic methods. Surfaces, for example, are eloxed, zinc-plated, blackened, chromatized or phosphated. As well as passive corrosion protection methods, there also exist some active methods in which coatings release corrosion-inhibiting substances.

Owing to exceptional demands on the anticorrosion layer, for example good heat transfer in the case of heat transferers (colloquially called heat exchangers) or high precision in the reproduction of the surface structure to be protected (edges, embossments, etc.), there is a need for thin anticorrosion layers which alter the surface to be protected to a minimum degree, do not release any heavy metals and do not excessively expose the substrate to heat in the coating operation. This need can be covered, for example, with plasma polymer anticorrosion layers which are typically applied within a layer thickness range of 10 to 5000 nm. In addition, the plasma polymer coating method is suitable in principle for penetrating into tight structures as frequently exist, for example, in a heat transferer, or else for obtaining fitting accuracy of the component.

In order to be able to apply plasma polymer anticorrosion layers in an economically favorable manner, either a very high layer deposition rate and/or a means of being able to coat many components at the same time or a large component surface is desirable. In addition, it would be highly advantageous if the substrate to be coated did not have to be subjected to a special pretreatment.

DE 19748240 A1 (FhG) describes a method of producing a plasma polymer anticorrosion system in which the substrate is first smoothed prior to the coating and a first process step with reducing plasma conditions is used. As to the composition of the coating itself, it is merely stated that it is a coating produced from hydrocarbons or organosilicon substances. During the coating, oxygen, nitrogen or a noble gas is additionally fed into the plasma. There are no details either as to the composition or as to further particular properties of the coating.

However, it is stated that the coating is suitable as an anticorrosion layer for heat transferers in condensing boilers.

The aim of DE 10200700611 A1 (FhG) is a scratch-resistant and extensible anticorrosion layer for lightweight metals. For this coating, nanohardness values in the range from 2.5 to 6 GPa are reported. In addition, the coating must not have a yellow color and can only have a carbon content of 5%-20% by means of XPS. This assures the desired hardness and scratch resistance.

For the coating, the process is conducted in such a way that a self-bias between 50 and 1000 V develops. This has the advantage that, for its part, a high deposition rate can be achieved, since layer thicknesses from 2-4 µm upward are advantageous for scratch-resistant layers. Furthermore, the layers grow under constant ion bombardment, resulting in constant rearrangement and constant energy input, such that the layers can relax. This assures exceptional extensibility of the layers.

For the coating, gas ratios of HMDSO to $O_2$ between 1:1 and 1:6 are specified as advantageous. However, upscaling can be conducted only with very great difficulty, since the development of the self-bias depends on the surface to be coated in relation to the mass surface area of the low-pressure plasma chamber. This also limits economic viability. Moreover, it can be assumed that the coating in narrow gaps can be conducted only to a very limited degree, since the electrical field weakens, is highly distorted and may no longer exist there. This adversely affects not just the deposition rate but also the layer quality.

The aim of DE 102009002780 A1 (FhG) is a scratch-resistant and extensible anticorrosion layer for non-lightweight metal surfaces. Here, nanohardnesses in the range from 2.5 to 10 GPa and extensions until microcracking of >1.5% are claimed.

Further plasma polymer anticorrosion layers use multilayer structures. For example, JP 63235463 A presents a plasma polymer anticorrosion layer on metallic substrates with the aid of a monomer having a polar group (e.g. pentafluoroacetophenone) and adds on a second coating layer produced with a hydrophobic fluorinated monomer (e.g. hexafluorobenzene).

JP 2154993 A likewise improves the corrosion resistance by means of a two-layer structure. Here, the inner layer consists of a hydrophobic organic film covered with a hydrophilic plasma polymer outer film. The latter is produced, for example, from organic aminic products (e.g. n-butylamine, isopropylamine).

Other approaches to a solution pursue the oxidation of the metal surface with the aid of a plasma process (WO 02059391 A1). The resultant surface can be provided with any plasma polymer film. As well as 2-layer structures, multilayer structures are also proposed (WO 02059051 A2).

The multilayer structures also include WO 9701656 A1, but this envisages a highly hydrophilic outer layer in order to promote the formation of a water film.

It is additionally known that strong alkalis should not be kept in glass vessels, since they attack most glasses. Instead, vessels made from plastics are preferred, for example from polyethylene. Accordingly, it seems inadvisable to use $SiO_2$-like layers as anticorrosion layers for strong alkalis.

It has been found in studies that not only good surface coverage of the substrate with a plasma polymer anticorrosion layer is needed to obtain a good anticorrosive effect, as suggested by the smoothing of the substrate in DE 19748240 A1 or by a higher layer thickness in the range from 2-5 µm as in DE 10 2007 00 611 A1 and DE 10 2009 002 780 A1; what is also needed is optimal stability of the coating with respect to the agent acting on the surface, for example strong acids or alkalis. This can be achieved, for example, by means of $SiO_2$-like coatings in relation to strong acids. However, such layers have very high internal stress, and so have poor adhesion and a tendency to crack, especially when they are thicker than 50 nm. Thus, the successful coating of metallic substrates with technical surface roughness is virtually impossible. Moreover, the deposition rate for such layers is very poor, since it is necessary to work with a high oxygen excess. Finally, these layers are unusable for strong alkalis.

For many applications, an improvement in the anticorrosion properties over the prior art is desirable. This relates especially to resistance to strong alkalis and acids combined with a comparatively high hardness and good implementability of corrosion protection. More particularly, the anticorrosion layer should also be depositable in narrow gaps and/or not require any special smoothing processes on the surfaces to be protected. In addition, it is desirable to be able to apply corrosion protection over a large area, rapidly and inexpensively.

In accordance with the above, the problem addressed by the present invention was that of providing surfaces which provide improved properties for a multitude of industrial requirements. More particularly, it was preferable in the first aspect of the invention that the surfaces provided have good separation properties, especially for separation methods in plastics processing and here especially for separation in the plastics processing of fiber composite materials.

In addition, a preferred problem addressed in the second aspect of the invention was that of specifying a means of improved corrosion protection for many fields of application. More particularly, it was desirable for the corrosion protection of the invention to be applicable effectively, over a large area and/or inexpensively even to surfaces having significant structuring, for example gaps and deep encroachments. The anticorrosion system should primarily have good efficacy, especially on aluminum alloy surfaces, preferably even without prior surface smoothing of the substrate. Of particular significance in this context was for the anticorrosion system of the invention to have good mechanical usability, since the surfaces to be protected in many fields of application are exposed to mechanical stresses.

This problem is solved by a solid plasma polymer body, especially plasma polymer layer, wherein the lower limit of the modulus of elasticity of the coating is defined by the following function (1):

$$E=25-31.5*x+13.5*x^2-1.85*x^3 \quad (1)$$

with
x=C/O ratio determined by means of XPS
E=modulus of elasticity [GPa]
when E≥1.25 GPa and
x≤0.5 and ≤2.0
where the following apply to the maximum of the Si 2p peak on the surface of the layer, measured by means of XPS:
when modulus of elasticity <10 GPa: 102.5-102.8 eV
when modulus of elasticity 10-20 GPa: 102.7-103.1 eV and preferably when
when modulus of elasticity >20 GPa: >103.0 eV.

It has been found that, surprisingly, the solid plasma polymer bodies of the invention, especially plasma polymer layers, are of very good suitability both for the first aspect of the invention (improvement of the separation properties) and for the second aspect of the invention (corrosion protection).

Solid bodies of the invention and the layers of the invention are characterized in even more detail further down.

For the first aspect of the invention, the above problem is solved in a particularly efficient manner by a solid plasma polymer body, especially a plasma polymer layer, wherein the lower limit of the modulus of elasticity of the coating is determined by the following function (1):

$$E=25-31.5*x+13.5*x^2-1.85*x^3 \quad (1)$$

with
x=C/O ratio determined by means of XPS
E=modulus of elasticity [GPa]
when E≤1.5 GPa preferably ≤1.75 GPa, further preferably ≤2.5 GPa, especially preferably ≤3 GPa, and
x≥0.5 and ≤2.0,
where the following apply to the maximum of the Si 2p peak on the surface of the layer, measured by means of XPS:
when modulus of elasticity <10 GPa: 102.5-102.8 eV
when modulus of elasticity 10-20 GPa: 102.7-103.1 eV and preferably when
when modulus of elasticity >20 GPa: >103.0 eV.

Preferably, especially for the first aspect of the invention, under the aforementioned boundary conditions, the following applies to the lower limit of the modulus of elasticity:

$$E=32.5-38*x+13.6*x^2-1.17*x^3 \quad (1a)$$

and more preferably $$E=39.4-42.3*x+12.3*x^2-0.33*x^3 \quad (1b)$$

Preferably, especially for the first aspect of the invention, measured at the surface of the layer of the invention, the maximum of the Si 2p peak at a modulus of elasticity of 10-20 GPa is >102.8 to <103.0 eV.

For the second aspect of the invention (corrosion protection), the above-described problem is preferably solved by a solid plasma polymer body, especially a plasma polymer layer, where the lower limit of the modulus of elasticity of the coating is determined by the following function (1):

$$E=25-31.5*x+13.5*x^2-1.85*x^3 \quad (1)$$

with
x=C/O ratio determined by means of XPS
E=modulus of elasticity [GPa]
when E=1.25–10 GPa preferably 1.5-9 GPa, further preferably 2.0-8 GPa, especially preferably 2.5-7.5 GPa, and
x≥0.5 and ≤2.0,
where, on the surface of the layer, measured by means of XPS, the maximum of the Si 2p peak is at 102.5-102.8 eV.

Preferably, for the second aspect of the invention, under the aforementioned boundary conditions, the following applies to the lower limit of the modulus of elasticity:

$$E=25.75-31.5*x+13.5*x^2-1.85*x^3 \quad (1a)$$

and more preferably $$E=26.2-31.5*x+13.5*x^2-2*x^3 \quad (1b).$$

Plasma polymers differ from polymers in that there is fragmentation of precursors in the course of production thereof. Accordingly, plasma polymers, in contrast with conventional polymers, do not exhibit regular repeat subunits, although—according to the production process—short-range order cannot be ruled out.

The modulus of elasticity in the context of the present invention is determined by means of the method described in measurement example 1.

The C/O ratio is determined by means of XPS (x-ray photoelectron spectroscopy), in case of doubt according to measurement example 2. The same also applies to the shift in the maximum of the Si 2p peak.

BRIEF DESCRIPTION OF THE SEVERAL VIEWS OF THE DRAWINGS

The invention will be more fully understood by reference to the following detailed description of the invention in conjuction with the Drawings, of which.

DETAILED DESCRIPTION OF THE INVENTION

Figure 1:
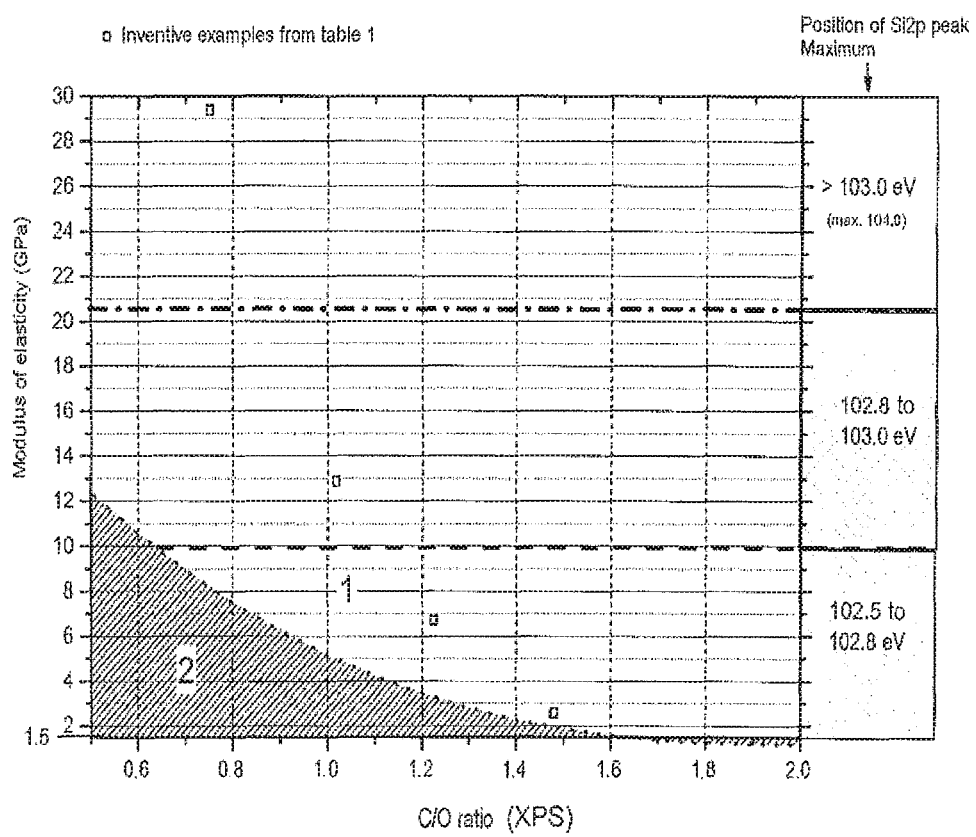
FIG. 1 shows, as a non-hatched area (1), a range for a preffered window of features according to a first aspect of the invention and a hatched area (2) representing a combination of features not preffered for a first aspect of the invention.

The range for the preferred window of features of the invention for the first aspect of the invention is shown in FIG. 1 as the non-hatched area (1). The hatched area (2) represents combinations of features that are not preferred for the first aspect of the invention or even noninventive.

Figure 4:
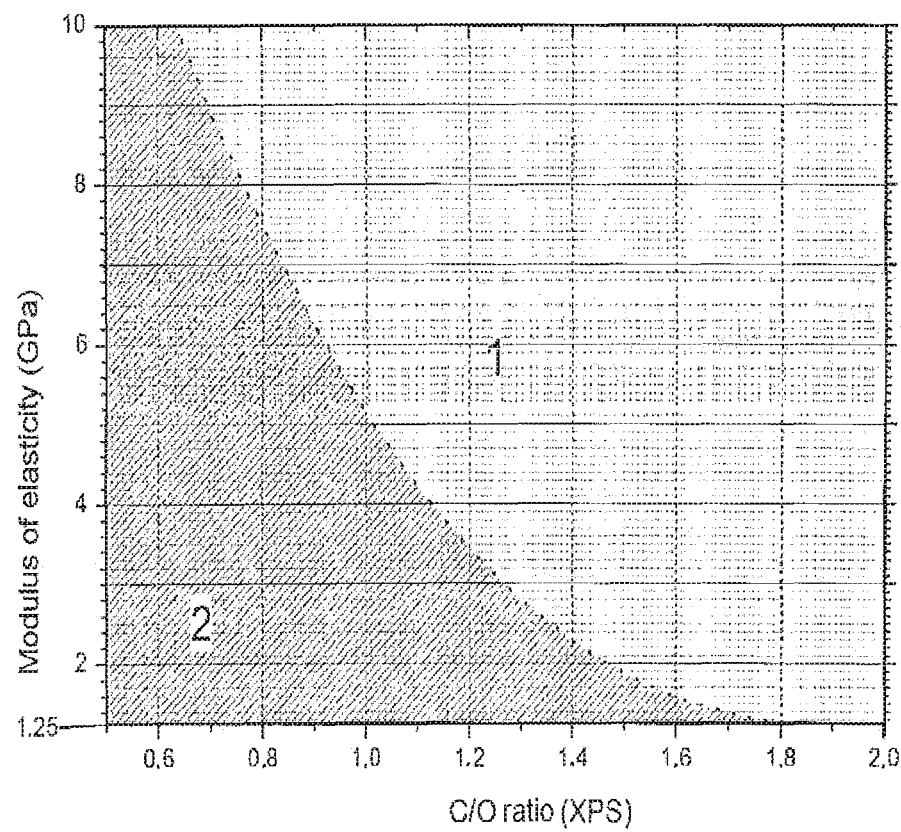
FIG. 4 shows, as a non-hatched area (1), a range for a preferred window of features according to a first aspect of the invention and a hatched area (2) representing a combination of features not preferred for a second aspect of the invention.

The range of the preferred window of features of the invention for the second aspect of the invention is shown in FIG. 4 as the non-hatched area (1). The hatched area (2) represents combinations of features that are not preferred for the second aspect of the invention or even noninventive.

The meaning of the features of the subject matter of the invention will only be immediately apparent to the person skilled in the art; therefore, further elucidations will be given here:

It is surprising that it is possible, at a given C/O ratio, to produce layers having a higher modulus of elasticity than was possible in the prior art to date if the position of the Si 2p peak is additionally taken into account. It is desirable, at a given C/O ratio, to obtain a high modulus of elasticity, since the C/O ratio affects the surface characteristics in relation to the surface energy. For example, a high C/O ratio tends to lead to a small polar component of the surface energy, which improves, for example, the separation properties of the layer and the resistance to alkalis, but simultaneously leads to low moduli of elasticity, as shown in FIGS. 1 and 4. However, a comparatively high modulus of elasticity is desirable especially for the second aspect of the invention, since the mechanical durability increases with the modulus of elasticity.

The position of the Si 2p peak (maximum) in turn gives information about the short-range binding conditions at the silicon atom within the plasma polymer layer, which includes information about the hardness conditions produced in the layer. Low Si 2p peak positions indicate a low-oxygen Si environment. If it rises, the SiO network is becoming ever more developed to become an $SiO_2$-like network. It is within the spirit of the invention when the plasma polymerization process is conducted to such an extent that, firstly, the formation of the SiO network is promoted to increase hardness and, secondly, the carbon-containing groups are burnt or oxidized by plasma chemistry to a minimum degree. The latter is manifested in a high C/O ratio and a low surface energy.

As already indicated, there have to date been regular attempts by those skilled in the art to produce an increased modulus of elasticity or increased hardness through an increase in the oxygen content during layer formation. This did have the desired consequences for the modulus of elasticity and hardness, but the layers were adversely altered at the same time, since the addition of oxygen resulted in simultaneous degradation of hydrocarbon groups and the C/O ratio. Ultimately, there was a distinct rise in the polar component of the surface energy.

It has now been found that, surprisingly, in the context of the invention, it is possible to produce distinctly improved moduli of elasticity when high powers are coupled into the deposition process during the deposition of the plasma polymer layers at given C/O ratios, and it is additionally possible to attain the desired window of features of the Si 2p peak. At the same time, it is possible to keep the polar component of the surface energy small. There have been no pointers to this approach in the prior art to date, and it was correspondingly impossible in fact to produce the layers of the invention according to the above-described window of features.

In other words, the profile of features of the present invention shows that the layer properties are in no way based exclusively on the physical composition, but are also caused to a significant degree by the manner of layer crosslinking (and hence by the plasma polymerization conditions). However, it was also found that the C/O ratio in the case of plasma polymer layers exerts a significant influence on the separation properties. Moreover, it was found that the C/O ratio and, in parallel, the polar component of the surface energy in the case of these layers exerts a significant influence on the surface properties (hydrophilicity, hydrophobicity), but also on the volume properties in terms of stability with respect to strong alkalis and acids.

As already indicated, it was already known to the person skilled in the art from the prior art that the modulus of elasticity and hardness of plasma polymer layers can be affected by the ratio of oxygen to carbon in the layer and by the ratio of oxygen to organosilicon precursor in the plasma process. However, the increase in the oxygen content leads to a high surface energy having a comparatively high polar component of the surface energy. Thus, surface properties, for example the separation properties or resistance properties to corrosive liquids, especially alkalis, were distinctly worsened.

In order to produce coatings of the invention (including preferred and particularly preferred coatings), one or more of the following measures are accordingly recommended:

use of a plasma polymerization system with HF excitation (e.g. 13.56 MHz) and a leakage rate of <0.3 mbar L/s, preferably <0.1 mbar L/s.

design of the system via the ratio of electrode area and mass area so as to result, under the conditions to be used at a later stage, in a self-bias of <10 V, preferably <1 V, and avoid secondary plasmas.

Use of organosilicon precursors together with oxygen-containing gases; preferably hexamethyldisiloxane (HMDSO) and $O_2$; more preferably HMDSO in similar amounts to $O_2$, for example in a ratio of 2:1 to 1:1 (especially first aspect of the invention) or use of organosilicon precursors together with oxygen-containing gases; preferably hexamethyldisiloxane (HMDSO) and $O_2$; more preferably HMDSO in an excess over $O_2$, for example in a ratio of 2:1 (especially second aspect of the invention).

Forming of electrical contacts of the metallic components to be coated with the HF electrode in such a way that the side to be coated can come into contact with the plasma polymerization process.

If nonconductive samples (e.g. wafers, microscope slides) are used, they should preferably not exceed a thickness of 2 mm, in order that the plasma can form virtually unhindered above the sample. This applies especially to the first aspect of the invention.

Setting up a series of powers, for example between 500 and 1500 W, and determining the layer properties, especially the modulus of elasticity, and optionally the nanohardness, as the surface energy and/or the polar component thereof. It should be taken into account here that the modulus of elasticity and surface energy increase with rising power.

Increasing/lowering the total amount of gas (with the same mixing ratio) to decrease/increase the modulus of elasticity and possibly the nanohardness of the coating. It should be taken into account here that the modulus of elasticity increases with decreasing total amount of gas.

Many parameters used in the literature, for example the Yasuda parameter, the Becker parameter or the reactor parameter, should not be cited for macroscopic description of the plasma polymerization process, since they do not take account of all the boundary conditions of the coating process. Vissing [Vissing, K.: Aufskalierung plasmapolymerer Beschichtungsverfahren [Upscaling of Plasma Polymer Coating Processes], Thesis, Culliver, (2008) ISBN 978-3-86727-548-4] showed, using the example of separation layers, that a new parameter V can better reflect the situation of layer production in different reactors, since it takes account of the plant size, the mass flow rate and the plasma power used. The plants represented therein correspond to the prior art.

Adapted to the electrode configuration used in accordance with the invention, V is calculated not with the reactor length LA but with the effective electrode area (electrode area over which plasma can be formed). The resulting parameter V* can additionally be used in order to describe the coating of the invention and give the person skilled in the art pointers. From the adjusted parameter V*, for a given gas flow ratio, with a plant of any size, it is possible to infer the necessary order of magnitude of power introduced for the total amount of gas introduced. Preferred values of V* for the production of the solid body of the invention or layers (in the process of the invention, see below) are:

$$1.5*10^9 \text{ to } 5*10^9 \text{ Js/g cm}$$

However, the new parameter cannot directly describe the crosslinking situation which arises from the gas composition and the degree of fragmentation.

Astonishingly, as already indicated, under the above-specified boundary conditions, it is possible even without additional addition of oxygen to produce separation layers and/or anticorrosion layers with higher modulus of elasticity and possibly simultaneously reduced surface energy than suggested by the prior art.

In accordance with the above, it is preferable that the plasma polymer layers of the invention consist to an extent of 90%, preferably 95%, more preferably 98% and most preferably entirely of the elements C, O, Si, H and optionally fluorine. In many cases, it is preferable when no fluorine is present in the layers of the invention either. In principle, layers of the invention can be produced particularly effectively via the use of organosilicon precursors in combination with oxygen. In this regard, reference is also made, for example, to the above-cited documents that form the prior art.

Since it is possible, with the new findings on which the present invention is based, at a given C/O ratio, to obtain higher moduli of elasticity than described to date in the prior art, it is also possible to obtain particularly favorable surface energy conditions at given moduli of elasticity. This was not foreseeable from the prior art either.

Correspondingly, a preferred solid plasma polymer body or a preferred plasma polymer layer in the context of the invention is one wherein the maximum polar component of the surface energy of the surface is determined by the following functions (2) or (2a):

$$\sigma(p)=0.28*E+0.106 \tag{2}$$

or $$\sigma(p)=1.2 \tag{2a}$$

whichever value of the functions (2) and (2a) is the greater,
with
$\sigma(p)$=polar component of the surface energy [mN/m]
E=modulus of elasticity [GPa]
when E=1.5-30 GPa preferably 1.75-28 GPa, further preferably 2.5-25 GPa, and especially preferably 3-25 GPa (these elasticity values apply preferably to the first aspect of the invention) or
when E=1.25-10 GPa preferably 1.5-9 GPa, further preferably 2.0-8 GPa, and especially preferably 2.5-7.5 GPa (these elasticity values apply preferably to the second aspect of the invention)
and/or
the surface energy of the surface, in terms of its upper limit, is determined by the following function (3):

$$\sigma=0.9*E+21.7 \tag{3}$$

and the surface energy of the surface, in terms of its lower limit, is determined by the following function (4):

$$\sigma=0.25*E+22.25 \tag{4}$$

with
$\sigma$=surface energy [mN/m]
E=modulus of elasticity [GPa].

The preferred modulus of elasticity ranges apply generally to this invention, i.e. without necessarily being tied to the surface energy. Preferably, function (2a) applies irrespective of the values of function (2) as the upper limit for the maximum (polar) component of the surface energy.

The surface energy and the polar component of the surface energy is determined in accordance with measurement example 3.

Figure 2:
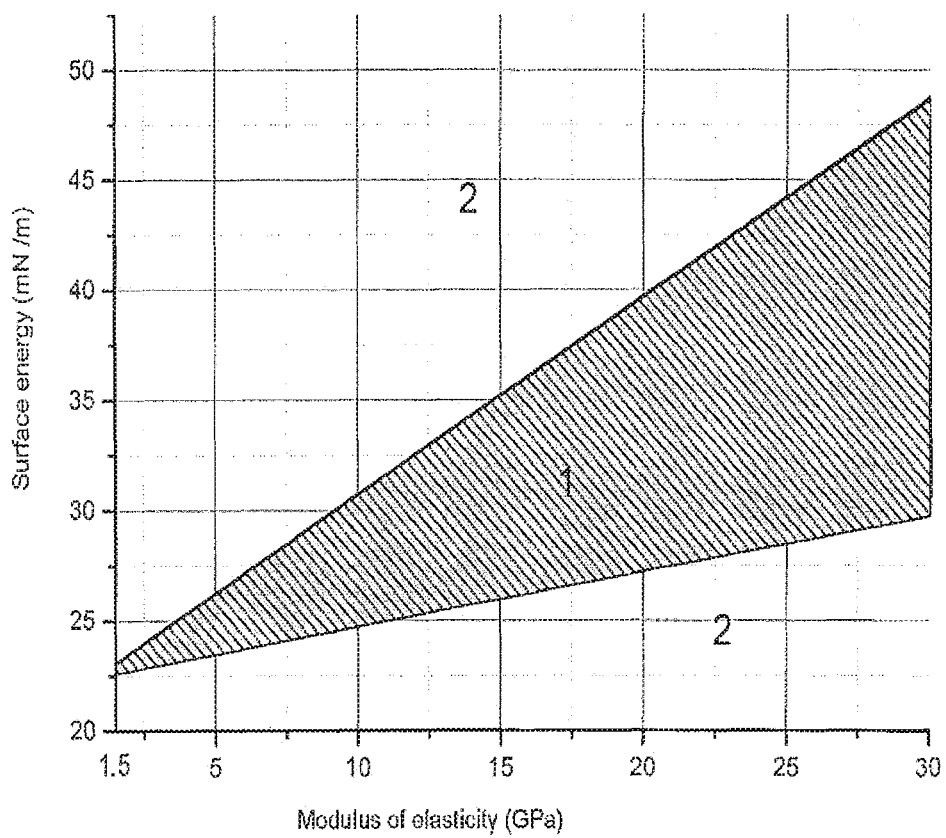
FIG. 2 shows, as a hatched area (1), a window of features of modules of elasticity versus surface energy defined by equations (3) and (4) which is preferred for a first aspect of the invention and ranges (2) show non-preferred combinations of features.
Figure 5:
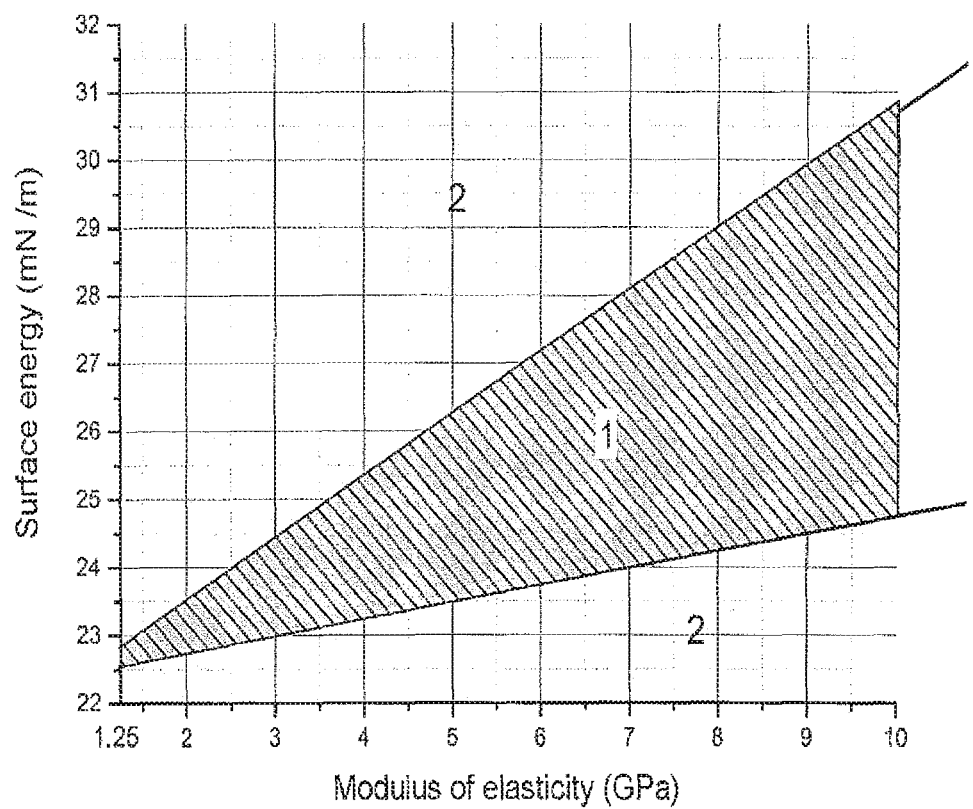
FIG. 5 shows, as a hatched area (1), a window of features of modulus of elasticity versus surface energy defined by equation (3) and (4) which is preferred for a second aspect of the invention and ranges (2) show non-preferred combinations of features.

FIG. 2 shows, as the hatched area (1), the window of features of modulus of elasticity versus surface energy defined by equation (3) and (4) which is preferred for the first aspect of the invention. FIG. 5 shows the same for the second aspect of the invention. The ranges (2) each show non-preferred and noninventive combinations of features.

Figure 3:
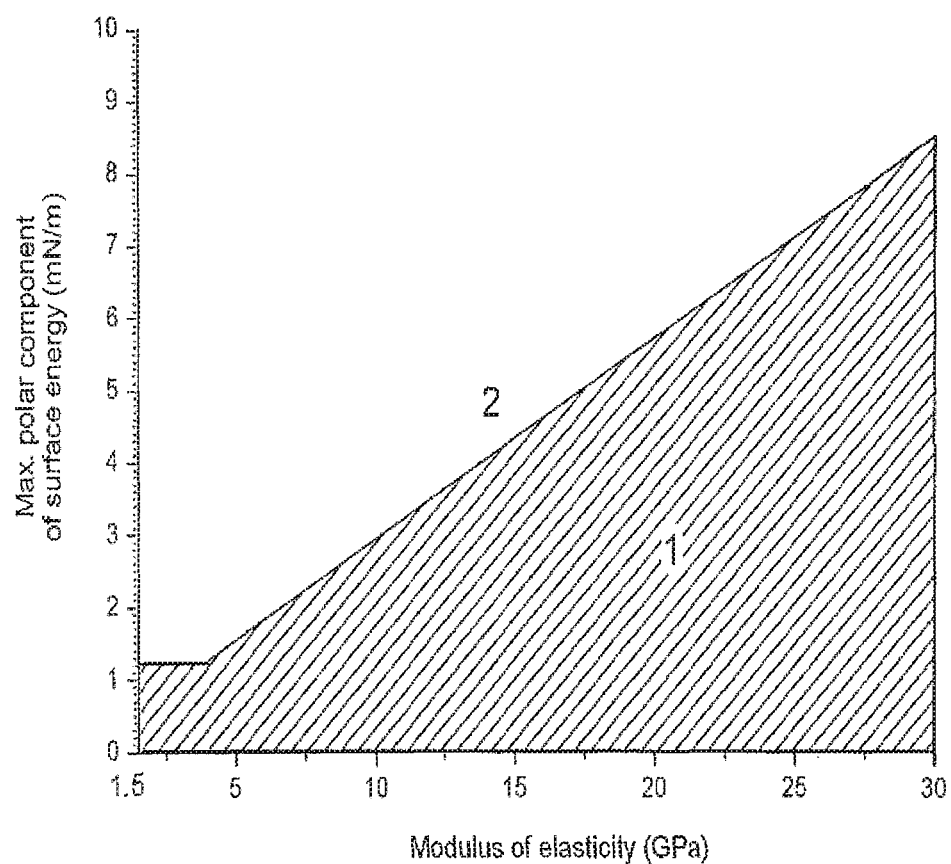
FIG. 3 shows, as a hatched area (1), a preferred window of features of modulus of elasticity versus maximum polar component of surface energy defined by equations (2) and (2a) for a first aspect of the invention and a non-hatched area (2) shows windows of properties of layers suggested in prior art.
Figure 6:
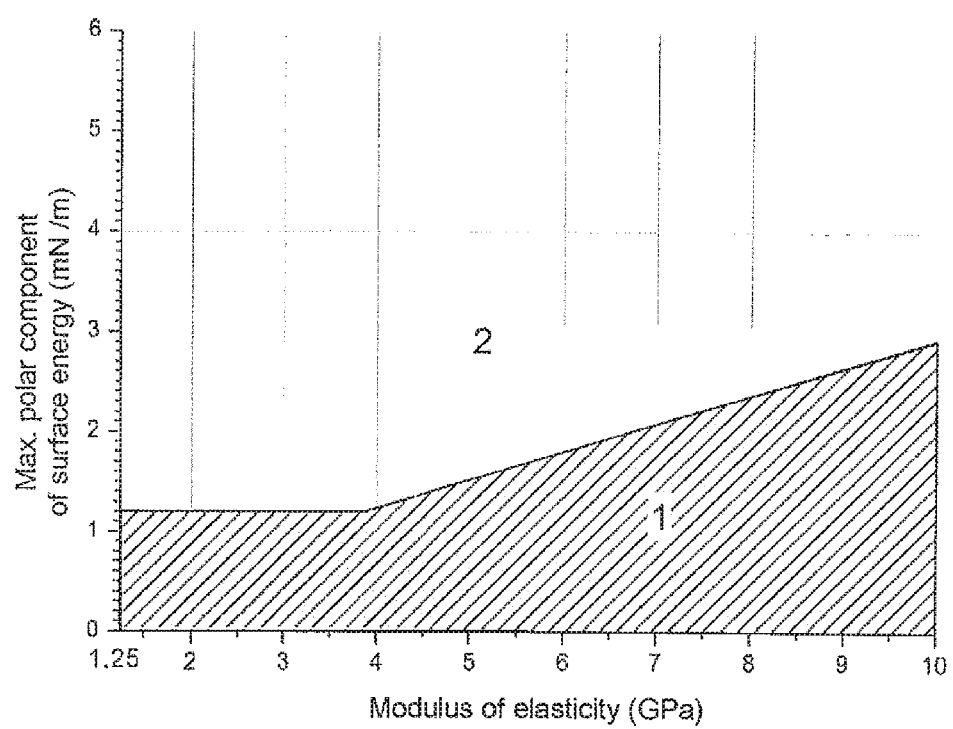
FIG. 6 shows, as a hatched area (1), a preferred window of features of modulus of eleasticity versus maximum polar component of surface energy defined by equations (2) and (2a) for a second aspect of the invention and a non-hatched area (2) shows windows of properties of layers suggested in prior art.

FIG. 3 (for the first aspect of the invention) and FIG. 6 (for the second aspect of the invention) show, as a hatched area (1), the preferred window of features of modulus of elasticity versus maximum polar component of the surface energy defined by the equations (2) and (2a). It should be noted here that the layers suggested in the prior art, in terms of their windows of properties, are each outside the window of features laid down by the equations (3) and (4), and (2) and (2a) (the non-hatched area (2)).

It should be pointed out here that, for most plastics applications, but especially for fiber composite materials, a minimum surface energy and especially a minimum polar component of the surface energy are desirable.

Through the above-described process regime, it is surprisingly possible to produce anticorrosion layers having a particularly desirable window of properties in terms of the ratio of modulus of elasticity to surface energy or to maximum polar component of the surface energy. The effect of this window of properties is that there is particularly good resistance to aggressive chemicals, especially to alkalis, in relation to the given hardness.

It has been found that, surprisingly, particularly good corrosion protection in the field of organosilicon plasma polymer coatings can be achieved precisely when the coating has low energy and especially has a low polar component of the surface energy (preferably here ≤3 mN/m, further preferably ≤2 mN/m and especially preferably ≤1.5 mN/m), and not when intense fragmentation of the precursor which is used for the plasma polymer coating has taken place and, in this way, a multitude of polar groups is incorporated.

Polar groups in plasma polymer layers are usually caused by the presence of oxygen and/or water during the plasma polymerization process, but also directly after the coating during the venting of the vacuum system.

As well as a low proportion of polar groups in the coating, the layer has good crosslinking and is sufficiently hard that it is ready to use particularly even for corrosion protection. This is assured by virtue of the layers of the invention having a modulus of elasticity of 1.25 to 10 GPa, preferably 1.5 to 9.0, especially preferably 2.0 to 8.0 and further preferably 2.5 to 7.5 GPa.

A particularly good layer quality, especially for the purposes of corrosion protection, is achieved when, as well as a low polar component of the surface energy, there is simultaneously a high, dispersed (nonpolar) component ≥23 mN/m, preferably ≥25 mN/m, further preferably ≥27 mN/m) of the surface energy.

Preference is given in accordance with the invention, moreover, to a solid plasma polymer body or a plasma polymer layer where the surface has a refractive index at 550 nm of 1.4 to 1.54, preferably of 1.44 to 1.54.

Surprisingly, the layers of the invention, in their preferred form, have a refractive index that indicates good suitability for the desired end use. The higher the proportion of Si—O—Si and not of $SiO_2$ structural units in the coatings of the invention, given the same surface energy, the greater the modulus of elasticity and the hardness. In addition, the refractive index rises.

Preference is given in accordance with the invention, especially for use as a separation layer and/or anticorrosion layer, to a plasma polymer layer, where the layer has a layer thickness of 5 nm to 20 µm, preferably 200 nm to 10 µm and especially preferably 400 nm to 5 µm.

With these layer thicknesses, it is possible to produce separation layers and/or anticorrosion layers having particularly good shape retention and longevity, and to cover technical surface roughness, such that it is possible to dispense with special smoothing methods.

Preference is given to a plasma polymer layer of the invention, wherein the hardness of the layer measured by means of nanoindentation is 0.5 GPa, preferably 1 GPa and further preferably 1.5 GPa.

The hardness of the layers of the invention is preferably measured as described in measurement example 1.

The fact that the layers of the invention, at a given C/O ratio and modulus of elasticity, have comparatively high hardnesses is likewise surprising and was not foreseeable from the prior art. Specifically the fact that a combination of high modulus of elasticity or high hardness with low surface energy or a low polar component of the surface energy can exist makes the layers of the invention particularly suitable for the envisaged end use because they are found to be chemically and mechanically durable. If the combination of the suitable surface energies is also taken into account in this regard, the layers of the invention, especially in the preferred variants, constitute a distinct improvement over the prior art.

In accordance with the above, preference is given in accordance with the invention to a plasma polymer layer wherein the molar ratios on the surface of the layer measured by means of XPS are

| O:Si | 1.0 to 2.0, preferably 1.15 to 1.7 | and/or |
|------|------------------------------------|--------|
| C:Si | 1.1 to 2.5, preferably 1.3 to 2.0. |        |

As well as the C/O ratio, the further molar ratios described have also been found to be particularly suitable. Particular preference is given in accordance with the invention to a plasma polymer layer where the molar proportions on the surface of the layer measured by means of XPS as follows:

O: 25-50 at %, preferably 28-45 at %
Si: 22-28 at %, preferably 23-27 at %
C: 28-50 at %, preferably 30-50 at %, further preferably 32-47 at %, based in each case on the total number of atoms present in the layer minus H.

The respective determinations of molar proportions are effected by means of XPS, in case of doubt as described in measurement example 2.

In the deposition of the layers of the invention, compared to the uncontacted state (free-floating structure), both a distinct increase in the deposition rate and good accessibility of the coating in relation to deep depressions in the component to be coated are achieved.

The user will ensure that the plasma polymerization process is supplied with oxygenous gases only in small amounts; the user will likewise ensure a low leakage rate (preferably ≤5 sccm determined via a pressure rise curve over a period of at least 1 h) and a low water load in the vacuum tank.

Also part of the invention is the use of a plasma polymer layer of the invention (especially that preferred for the first aspect of the invention) as separation layer in a mold.

In this connection, it is preferable that the separation is effected with respect to a plastic, preferably with respect to a fiber composite.

It is most preferable in accordance with the invention that the use is effected in such a way that the separation is a separation with respect to a plastic selected from the group consisting of elastomer, thermoplastic and thermoset, where the particular plastic may, for example, be a fiber-reinforced plastic (FRP), an adhesive, a sealant, a foam or an injection-molded plastic.

In the uses of the invention, especially the preferred uses of the invention, the layers of the invention are able to display their properties particularly effectively.

Also part of the invention is the use of a layer of the invention (especially that preferred for the first aspect of the invention) for improving the cleanability of a solid body with water, aqueous substances, $CO_2$ and/or solvents.

Also part of the invention is the use of a plasma polymer layer of the invention (especially that preferred for the second aspect of the invention) for improving corrosion protection at the surface. There is an improvement in corrosion protection at least when the action of strong acids and alkalis results in a slowed alteration of the surface compared to the uncoated state. It is preferable for this purpose, as a quick test, to test the coated surface with 25% sulfuric acid at 65° C. over a period of 15 to 60 min and compare it with an uncoated identical surface which has been subjected to the same stress. Analogously, it is possible to test alkali stability preferably with 1 molar sodium hydroxide solution at room temperature, preferably at 60° C. over a period of 15 to 60 min. There is an improvement in corrosion protection when the test for alkali or acid stability, preferably both tests, demonstrate(s) a slowed alteration of the surface by virtue of the coating of the invention, preferably detectable by the naked human eye.

Preference is given to a use of the invention wherein the surface consists of a metal or metal alloy or comprises a metal or metal alloy.

Metals for the purposes of this text are the alkali metals, the alkaline earth metals, and the elements having atomic numbers 13, 21 to 31, 39 to 50, 57 to 83 and 89 to 94, provided that they are in the solid state. Under particular circumstances, germanium and antimony, and also the transition metals boron, silicon, arsenic and tellurium, may be included among the metals.

Preferred metals which can be protected by the layers of the invention are aluminum, iron, here especially steel, magnesium, copper, silver, zinc, nickel, titanium and alloys thereof.

Also part of the invention is a solid body comprising a substrate and, applied to this substrate, a coating of the invention. This solid body—at least in the region of the coating of the invention—is thus imparted with the advantageous properties in the coating of the invention at its surface.

Accordingly, preference is given in accordance with the invention (especially for the first aspect of the invention) to a solid body selected from the group consisting of device for shaping FRPs or other plastics, press, forming mold, injection mold, casting mold, static seals, components of adhesive application devices, pans and other cooking devices, photovoltaic modules and other elements that serve to generate power, components for the packaging industry, for example conveyors or transport elements, components of painting and printing devices, for example conduits, covers or ink vessels.

Preference is given especially to a solid body of the invention wherein the substrate in the second aspect of the invention consists of or comprises, at its surface, a metal or metal alloy and upon its surface, in the region of the metal or metal alloy, is a coating of the invention.

Preference is given (especially in the second aspect of the invention) to a solid body of the invention formed from the group consisting of heat transferers, automotive wheel rims, medical equipment or tools, furniture decoration, pull-out rails, for example for domestic ovens, kitchens or furniture; decorative and functional elements for motor vehicles, for example decorative strips, and railings.

These everyday articles as solid bodies of the invention can be protected particularly efficiently with the coating of the invention.

Also part of the invention is the use of a layer of the invention for improving the cleanability of a solid body, as described above particularly in the second aspect of the invention, defined in each case without a corresponding layer, with solvents, aqueous detergents and/or dry ice, since the favorable surface properties (see above) make it possible to positively influence the cleaning characteristics of surfaces as well with the corrosion layers of the invention. The preferred cleaning agent is water.

Also part of the invention is a method of producing a coated substrate, comprising the steps of:
a) providing a substrate to be coated and
b) coating the substrate with a coating of the invention.

Preference is further given to a method of producing a solid body having corrosion protection on its surface, comprising the steps of
a) providing a solid body having metal or metal alloy on its surface and
b) depositing a layer of the invention at least on part of the metallic or metal alloy-containing surface thereof.

Preference is given to conducting the (plasma polymer) coating method of the invention in such a way that a low-pressure high-frequency plasma is used, preferably with a frequency of 13.56 MHz. This preferably conductively connects the metallic component to be coated to the electrode. The electrode is chosen such that preferably only a very small self-bias, if any, of $\leq 50$ V, preferably $\leq 20$ V, further preferably 10 V, develops during the plasma polymerization process. Should this be impossible, the person skilled in the art will, for example, increase the ratio of electrode area to mass area (chamber wall) in a controlled manner, in order to reach the (preferred) working range.

Two essential advantages to the user arise from this procedure: there is no restriction in relation to the upscalability of the coating process, since the component surface to be coated can become very, very large, for example larger than 10 or 20 m$^2$. This makes it possible to implement the coating in a particularly economically viable manner.

Moreover, only very low-energy ion bombardment, if any, of the coating which forms takes place, and so no unnecessary oxidation is caused.

The invention is elucidated in detail hereinafter by examples: MEASUREMENT EXAMPLES Measurement Example 1 Modulus of Elasticity Nanoindentation is a test method with which a fine diamond tip (triangular pyramid [Berkovich], radius less than 100 nm) can be used to determine the hardness of surface coatings. In contrast to macroscopic hardness determination (for example Vickers hardness), what is measured here is not the remaining indentation hollow impressed by a standard force, but a penetration depth-dependent cross-sectional area of the nanoindenter. This depth-dependent cross-sectional area is determined via a reference sample having known hardness (generally fused silica).

During the application of the standard force, nanoindentation uses a sensitive deflection sensor system (capacitive plates) with which the penetration depth can be measured precisely as the standard force rises and falls again—quite differently to the conventional procedure. The standard force-penetration depth curve during the initial phase of load relief indicates the stiffness of the sample in situ. With the aid of the cross-sectional area of the nanoindenter known from the reference sample, it is thus possible to determine the modulus of elasticity and hardness of the sample. The maximum test force for nanoindentation is generally below 15 mN.

To measure the pure properties of the coating unaffected by the substrate, a rule of thumb of 10% of the layer thickness is used. Penetration curves at a deeper level include an influence of the substrate used. With rising penetration depths exceeding 10% of the layer thickness, the values measured approach the modulus of elasticity and the hardness gradually approaches that of the substrate. The described evaluation by this test method is named for Oliver & Pharr [W. C. Oliver, G. M. Pharr, An improved technique for determining hardness and elastic modulus using load and displacement sensing indentation experiments, J. Material Res. (1992) Vol. 7, No. 6, 1564-1583].

For simpler variation of the penetration depths at different loads, what is called the multiple loading and load relief method is used, the multi-indentation method for short. In this method, loading and load relief operations are undertaken segment by segment at a fixed point. The local load maxima are increased continuously. At the fixed point, it is thus possible to determine depth-dependent values of the modulus of elasticity and hardness. In addition, for statistical purposes, in a measurement field, various unaffected sites on the sample are likewise approached and tested. By comparison between individual indentation and multi-indentation methods, Schiffmann & Mister have shown that there are only very small deviations between the values ascertained in the two methods [K. I. Schiffmann, R. L. A. Mister; Comparison of Hardness and Young's Modulus by Single Indentation and Multiple Unloading Indentation, in: Zeitschrift für Metallkunde 95 (2004) 5, 311-316]. For compensation, longer hold times for prevention of creep effects of the piezoelectric scanner are suggested [K. I. Schiffmann, R. L. A. Mister; Comparison of Hardness and Young's Modulus by Single Indentation and Multiple Unloading Indentation, in: Zeitschrift für Metallkunde 95 (2004) 5, 311-316].

Accordingly, for example, in the case of samples from working example 2 (table 2), measurement was effected with 10 multi-indentations per site with a maximum of 0.055 mN. The multi-indentations have local force maxima which were then reduced to 20% of the force. These load relief curves were evaluated in the form of a tangent from 98% to 40%. 10 measurement points were tested for statistics and homogeneity. The distance between the measurement points was 50 μm, in order to avoid influences such as plastic deformations of the layer to be tested as a result of prior measurements, for example. The layer thickness was 1839 nm. For compliance with the rule of thumb for the penetration depth of max. 10% of the layer thickness, the load relief curves in the case of the multi-indentations of the example shown up to the maximum force of 0.055 mN are admissible for the evaluation. In the case of lower layer thicknesses, the corresponding maximum local force should be noted in order not to exceed the 10% rule.

For the nanoindentations of the working examples, a Universal Material Tester (UMT) with Nano-Head nanoindentation module (NH2) from CETR (now part of Bruker AXS S.A.S.) with appropriate vibration damping technology (minus k) in a thermal and acoustic isolation chamber was used.

In accordance with the multi-indentation method, as an example, in the case of samples which have been produced in accordance with the 2nd line of table 1 (working examples, example 1), measurement was effected with 10 multi-indentations per site with a maximum of 0.055 mN. The multi-indentations have local force maxima which were then reduced to 20% of the force. These load relief curves were evaluated in the form of a tangent from 98% to 40%. 10 measurement points were tested for statistics and homogeneity. The distance between the measurement points was 50 μm, in order to avoid influences such as plastic deformations of the layer to be tested as a result of prior measurements, for example. The layer thickness was 1839 nm. For compliance with the rule of thumb for the penetration depth of max. 10% of the layer thickness, the load relief curves in the case of the multi-indentations of the example shown up to the maximum force of 0.055 mN are admissible for the evaluation. In the case of lower layer thicknesses, the corresponding maximum local force should be noted in order not to exceed the 10% rule.

The maximum force for the penetration depth and the corresponding load relief curve here in case of doubt is 0.055 mN, preferably, in the case of layer thicknesses of 1000 nm, in case of doubt, 0.020 mN.

Measurement Example 2 XPS Measurements

The XPS measurements were used for the determination of molar ratios for the layers of the invention. The procedure for this purpose is as follows:

The XPS analyses were effected with a VG 220i-XL system (from VG Scienta). Parameters: magnetic lens mode, take-off angle of the photoelectrons 0°, monochromatized AlKα excitation, constant analyzer energy mode (CAE) with pass energy 70 eV in overview spectra and 20 eV in energetic high-resolution line spectra, and analysis area: 0.65 mm ø; electrically nonconductive samples are neutralized with low-energy electrons (4 eV). The detection sensitivity of the method is element-specific and is about 0.1 at %, i.e. about 1000 ppm. To compensate for charging effects, the C1s main photoemission line which can be assigned to C—C species is fixed at 285 eV in the evaluation; this correspondingly shifts the positions of the further photo lines.

The XPS spectrometer was set up with reference to ASTM Standard E902-94. ASTM Standard E 1078-90 was used with regard to the sample handling before and during the analysis. For the processing of the measurement data obtained, standards ASTM E 996-94 and E995-95 were consulted. Supporting documents are the references cited in the standards.

With the aid of this procedure, both the elemental compositions and the Si 2p peak shifts are found, as shown in tables 1 and 2.

Measurement Example 3 Surface Energy

The surface energy is determined in accordance with DIN 55660-2 of December 2011 with a Krüss G2 contact angle measuring instrument. This is done using water, diiodomethane and ethylene glycol having high purity as test fluids. The test fluids have the following characteristic data:

| | |
|---|---|
| Water | surface energy: 72.8 mN/m, polar component: 51.0 mN/m |
| Diiodomethane | surface energy: 50.8 mN/m, polar component: 0.0 mN/m |
| Ethylene glycol | surface energy: 47.7 mN/m, polar component: 16.8 mN/m |

The test method used is dynamic measurement (advancing contact angle), in which the edge angle is determined during the supply of liquid. In case of doubt, the baseline is set manually, horizontally at the midpoint between the tip of the peak and the mirror image. The needle distance is set to about 2 mm. Prior to the measurement, the surface is optionally cleaned with acetone (a single very gentle wipe with acetone and a lint-free cloth), in order to reduce the risk of false measurements.

The amount of test fluid used is 6 μL with a dosage rate of 11.76 μL/min. The actual measurement begins after 5 s, corresponding to a feed volume of about 1 μL. 3 drops are applied per liquid. The respective results are averaged.

The evaluation of the contact angle and the surface energy and of the polar component of the surface energy was effected via the drop shape analysis (DSA) software for Windows (version 1.91.0.2) from Krüss. For the determination of the contact angle, polynomial method 2 was used. The evaluation for surface energies up to 30 mN/m was undertaken according to Wu [S. Wu, Calculation of interfacial tension in polymer systems, Journal of Polymer Science, Part C: Polymer Symposia (1971), Vol. 34, Issue 1, 19-30], and for surface energies exceeding 30 mN/m according to Owens-Wendt-Rabel-Kaelble. The evaluation was effected without error weighting.

The values reported in tables 1 and 2 for the surface energy and the polar component thereof were found.

WORKING EXAMPLES

Example 1

All samples were produced using a 1 m³ plasma polymerization system as described in [Vissing, K.: Aufskalierung All the plasma parameters used (HF power, gas flows, pressure) for the examples can be found in table 1, as can the corresponding measurement results and parameters calculated.

If the following gas flows are set during the coating: HMDSO 60 sccm and $O_2$ 30 sccm, and an HF power of 1500 W is used, a coating featuring the composition and profile of properties according to table 1 is deposited. This describes a coating featuring a very high modulus of elasticity at a C/O ratio of 1.22. In addition, in spite of the high modulus of elasticity, a coating having a low surface energy and low polar component is deposited, which is of outstanding suitability as a separation layer for CFRP processing. By contrast, the noninventive reference example shows that, even though the gas flow rates are as in examples 1 and 2, the window of properties of the invention is not attained. This is also true, for example, of the examples from WO 03/002269.

TABLE 1

| Reference | HMDSO flow rate [sccm] | O2 flow rate [sccm] | Power [W] | Pressure [mbar] | Modulus of elasticity [GPa] | C [at %] | O [at %] | Si [at %] | O/Si | C/Si | C/O | Si 2p-maximum peak position [eV] | SFE [mN/m] | Polar component [mN/m] |
|---|---|---|---|---|---|---|---|---|---|---|---|---|---|---|
| Reference example | 60 | 30 | 500 | 0.016 | 0.9 | 45.7 | 29.1 | 25.2 | 1.15 | 1.81 | 1.57 | 102.6 | 22.5 | 0.53 |
| Example 1 | 60 | 30 | 900 | 0.016 | 2.8 | 44.4 | 30.3 | 25.3 | 1.20 | 1.75 | 1.47 | 102.65 | 23.4 | 0.79 |
| Example 2 | 60 | 30 | 1500 | 0.016 | 7.0 | 41.0 | 33.7 | 25.3 | 1.33 | 1.62 | 1.22 | 102.6 | 27.2 | 2.04 |
| Example 3 | 45 | 45 | 1500 | 0.016 | 12.8 | 37.9 | 36.7 | 25.5 | 1.44 | 1.49 | 1.03 | 102.8 | 29.0 | 3.40 |
| Example 4 | 30 | 60 | 1500 | 0.016 | 29.3 | 32.7 | 41.9 | 25.1 | 1.67 | 1.30 | 0.78 | 103.1 | 30.5 | 4.89 | plasmapolymerer Beschichtungsverfahren, Thesis, Culliver, (2008) ISBN 978-3-86727-548-4]. In the present case, however, it differed in that it had an electrode system with an open area of about 2.9 m², such that the self-bias of this system within the range of the working parameters specified in table 1, measured by means of the matchbox of the HF system, was reliably <10 V.

All samples were positioned directly on the electrode, such that the plasma could nevertheless form above it without any problem even in the case of the flat nonconductive samples, for example wafers or microscope slides.

The total leakage rate of the system was determined beforehand via the pressure rise method to be less than 0.3 mbar L/s.

After an oxygen pretreatment of the samples, a gas flow rate of 60 sccm of HMDSO and 30 sccm of $O_2$ at a working pressure (regulated by means of a butterfly valve) of 0.016 mbar (reference example and examples 1 and 2; cf. table 1) was set. After the setting of the pressure by regulation, the plasma, in example 1 with a forward power as specified in the table under "Power", was ignited. This state was maintained until the desired layer thickness had been attained. Thereafter, the power was set to zero and hence the plasma was shut down. Subsequently, the gas flow was likewise reduced to zero, and so it was then possible to commence the venting operation.

The coating thus formed has a modulus of elasticity (measured by means of nanoindentation) as reported in table 1. For the coating from example 2 (table 1), for example 7 GPa at a C/O ratio of 1.22 and a surface energy von 27.2 mN/m.

Example 2

Eloxed aluminum (Unidal 7090; Eloxal thickness=14-16 μm (Eloxal hardness=200-400 HV; compacted) is processed, for example, to give instrument carriers for medical technology applications. In this case, the surface has to be protected against the action of strong alkalis and hot steam during disinfection and sterilization, in order to assure a constant visual impression. In this case, for visual and financial reasons, smoothing processes are not an option as pretreatment methods, and so it was possible to protect the metal surface by means of a plasma polymer anticorrosion layer of the invention.

The coating conditions were:

Use of a 5 m³ plasma polymerization system having a full-area HF electrode system [Vissing, K.: Aufskalierung plasmapolymerer Beschichtungsverfahren, Thesis, Culliver, (2008) ISBN 978-3-86727-548-4]. In the present case, however, it differed in that it had an electrode system with an open area of about 8 m², such that the self-bias of this system, measured by means of the matchbox of the HF system, was reliably <10 V.

All samples were positioned directly on the electrode, such that the plasma could nevertheless form above them without any problem even in the case of the flat nonconductive samples, for example wafers or microscope slides.

The total leakage rate of the system was determined beforehand via the pressure rise method to be less than 0.3 mbar L/s. After a pretreatment of the samples with an oxygen plasma, at a working pressure of 0.028 mbar regulated by means of a butterfly valve, 200 sccm each of HMDSO and $O_2$ were admitted continuously. To form a plasma, a forward power of 4200 W was used for a period of 4500 s. Thereafter, the power was set to zero and hence the plasma was shut down. Subsequently, the gas flow rate was likewise reduced to zero, such that it was subsequently possible to commence the venting operation.

The plasma polymer coating formed had a thickness of about 2 μm, and possessed a surface energy of 24.7 mN/m with a polar component of 1.1 mN/m. Correspondingly, a static water contact angle of 100° was measured. The modulus of elasticity of the coating was 3.05 GPa measured by means of nanoindentation.

All samples were positioned directly on the electrode, such that the plasma could nevertheless form above them without any problem even in the case of the flat nonconductive samples, for example wafers or microscope slides.

The total leakage rate of the system was determined beforehand via the pressure rise method to be less than 0.3 mbar L/s.

After an oxygen pretreatment of the samples, a gas flow rate of 60 sccm of HMDSO and 30 sccm of O2 at a working pressure (regulated by means of a butterfly valve) of 0.016 mbar was set. After the setting of the pressure by regulation, the plasma, in example 2 (table 2) with a forward power of 1200 W was ignited. This state is maintained until the desired layer thickness has been attained. Thereafter, the

TABLE 2

| Type | HMDSO flow rate [sccm] | O2 flow rate [sccm] | Power [W] | Pressure [mbar] | Modulus of elasticity [GPa] | C [at %] | O [at %] | Si [at %] | O/Si | C/Si | C/O | Si maximum peak position [eV] | SFE [mN/m] | Polar component [mN/m] |
|---|---|---|---|---|---|---|---|---|---|---|---|---|---|---|
| Example 1 | 200 | 200 | 4200 | 0.028 | 3.5 | 44.1 | 30.9 | 25.0 | 1.24 | 1.76 | 1.43 | 102.65 | 24.3 | 1.10 |
| Counter example | 100 | 300 | 4200 | 0.028 | 9.9 | 32.9 | 42.2 | 24.9 | 1.69 | 1.32 | 0.78 | 103.1 | 31.7 | 4.10 |
| Example 2 | 60 | 30 | 1200 | 0.016 | 5.0 | 42.8 | 32.0 | 25.2 | 1.27 | 1.70 | 1.34 | 102.6 | 25.2 | 1.10 |

The efficacy of the anticorrosion layer was tested by applying one drop of an NaOH solution (1 molar) at room temperature for a period of 1 h.

There was no visible change in the surface, whereas uncoated or poorly coated surfaces immediately have a reaction as a result of blister formation, and a distinct change in the test surface is observed. In the uncoated case, a small hole has formed.

It was likewise possible to observe good corrosion stability with the aid of a sulfuric acid test (15 min, in 25% sulfuric acid at 65° C.).

The counterexample from table 2 shows that it is possible to attain the desired modulus of elasticity in the case of an unsuitable process regime in the same system, but the polar component is much too great and hence the position of the Si 2p peak is shifted into unwanted regions. The testing of corrosion stability accordingly also shows only moderate corrosion protection both in the acidic and in the basic range.

The results from this example and the process parameters can be found in table 2.

Working Example 3

To produce aluminum elements that can be sewn into textiles which are bleached, excellent corrosion protection in the high pH range is necessary, as is a certain mechanical stability.

In order to be able to provide solutions for such demands, samples of Al 99.5 sheet EN AW-1050A (red/black) H14 EN 573-3 EN 485-1,2,4, after conventional solvent degreasing, were finely cleaned thoroughly with an acetone-soaked cloth with the aid of an oxygen plasma, in order subsequently to continue directly with the coating as elucidated further down.

All samples were produced using a 1 $m^3$ plasma polymerization system as described in [Vissing, K.: Aufskalierung plasmapolymerer Beschichtungsverfahren, Thesis, Culliver, (2008) ISBN 978-3-86727-548-4]. In the present case, however, it differed in that it had an electrode system with an open area of about 2.9 $m^2$, such that the self-bias of this system, measured by means of the matchbox of the HF system, was reliably <10 V.

power is set to zero and hence the plasma is shut down. Subsequently, the gas flow is likewise reduced to zero, and so it is then possible to commence the venting operation.

The coating thus formed from example 2 (see table 2) has a modulus of elasticity (measured by means of nanoindentation) of about 5.0 GPa at a C/O ratio of 1.34 and a surface energy of 25.2 mN/m with a polar component of 1.1 mN/m.

The alkali stability was tested with the aid of an NaOH test in which 1 molar NaOH was applied to the surface at room temperature for one hour. No traces of corrosion (pitting or layer undermining) were apparent either with the naked eye or with a light microscope. Mechanical stability was tested on zip fastener elements by the use thereof. It was found that the elements, even after mechanical use, did not have any traces of corrosion in the NaOH test. By comparison, uncoated surfaces immediately exhibit severe attack over the full area. Samples having inadequate coating have pitting.

The invention claimed is:

1. A plasma polymer layer for being disposed upon a solid body,
   wherein a lower limit of a modulus of elasticity of the plasma polymer layer is determined by a following function (1):

$$E=25-31.5*x+13.5*x^2-1.85*x^3 \quad (1)$$

with
   x=a C/O ratio determined by means of XPS,
   E=the modulus of elasticity [GPa],
   wherein the E or the modulus of elasticity is ≥1.25 GPa and ≤30.0 GPa, and the x is ≥0.5 and ≤2.0;
   wherein at the E or the modulus of elasticity of ≥1.25 GPa and <10 GPa, the maximum of the Si 2p peak on a surface of the plasma polymer layer as measured by means of XPS is between 102.5 eV-102.8 eV; and
   wherein the plasma polymer layer is produced using a system having a ratio of electrode area and mass area resulting in a self-bias of less than 10 V.

2. The plasma polymer layer as claimed in claim 1, wherein a maximum polar component of a surface energy of the surface of the plasma polymer layer is determined by a function (2) or a function (2a):

$$\sigma(p) = 0.28*E + 0.106 \quad (2)$$

or $$\sigma(p) = 1.2 \quad (2a),$$

whichever value of the function (2) and the function (2a) is greater, with

σ(p)=a polar component of the surface energy [mN/m],
E=the modulus of elasticity [GPa],
wherein the E or the modulus of elasticity is ≥1.25 GPa and ≤30.0 GPa.

3. The plasma polymer layer as claimed in claim 1, wherein the surface of the plasma polymer layer has a refractive index at 550 nm of 1.4 to 1.54.

4. The plasma polymer layer as claimed in claim 1, wherein the plasma polymer layer has a thickness of 5 nm-20 μm.

5. The plasma polymer layer as claimed in claim 1, wherein a hardness of the plasma polymer layer as measured by means of nanoindentation is ≥0.5 GPa.

6. The plasma polymer layer as claimed in claim 1, wherein a molar ratio on the surface of the plasma polymer layer as measured by means of XPS is defined by at least one of:
O: Si 1.0-2.0, and
C: Si 1.1-2.5.

7. The plasma polymer layer as claimed in claim 1, wherein based on a total number of atoms present in the plasma polymer layer excluding H, a molar proportion on the surface of the plasma polymer layer measured by means of XPS is:
O: 25-50 at %,
Si: 22-28 at %, and
C: 28-50 at %.

8. The plasma polymer layer as claimed in claim 1, wherein the plasma polymer layer is disposed on the solid body in a mold as a separation layer.

9. The plasma polymer layer as claimed in claim 8, wherein the solid body is a fiber composite plastic.

10. The plasma polymer layer as claimed in claim 9, wherein the fiber composite plastic is selected from the group consisting of an elastomer, a thermoplastic and a thermoset.

11. A layer for improving a cleanability of the solid body with a cleaning substance selected from the group consisting of a water, an aqueous substance, a $CO_2$ substance and a solvent, wherein the layer comprises the plasma polymer layer as claimed in claim 1.

12. An anticorrosion layer for a surface of the solid body comprising the plasma polymer layer as claimed in claim 1.

13. A component comprising the plasma polymer layer as claimed in claim 12, wherein the plasma polymer layer is disposed on a surface of the solid body, and wherein the surface of the solid body consists of a metal or a metal alloy or comprises the metal or the metal alloy.

14. The component as claimed in claim 13, wherein the metal is selected from the group of substances consisting essentially of an iron, an aluminum, a magnesium, a copper, a silver, a nickel, a zinc, and a titanium, or the metal alloy consists essentially of a combination of one or more of the aforementioned substances.

15. A component comprising the plasma polymer layer as claimed in claim 1 and the solid body, wherein the plasma polymer layer is disposed on a substrate of the solid body.

16. The component as claimed in claim 15, wherein the substrate of the solid body comprises a metal or a metal alloy on a surface of the substrate, and the plasma polymer layer is disposed upon the metal or the metal alloy on the surface of the substrate.

17. The component as claimed in claim 16, wherein the solid body is selected from the group consisting of a heat transferer, an automotive wheel rim, a furniture decorative element, a pull-out rail, an automotive decorative element, an automobile functional element, a medical equipment element, a tool and a railing.

18. The component as claimed in claim 15, wherein the solid body is selected from the group consisting of a device for shaping FRPs or other plastics, a press, a mold forming device, an injection mold device, a casting mold device, a static sealing device, a component of an adhesive application device, a cooking device, a cooking pan, a photovoltaic module, a power-generating element, a packaging component, a conveyor, a transport element, a painting device, a printing device, a conduit, a cover, and an ink vessel.

19. A method of producing a coated substrate, comprising the steps of:
a) providing a substrate to be coated; and
b) coating the substrate with a layer as claimed in claim 1.

20. The method as claimed in claim 19, wherein
a) the substrate is a body having a surface containing metal or metal alloy; and
b) the substrate is provided with a surface layer as claimed in claim 1 at least in the region of the metal or metal alloy.

21. The plasma polymer layer as claimed in claim 1, wherein an upper limit of a surface energy of the surface of the plasma polymer layer is determined by a function (3):

$$\sigma = 0.9*E + 21.7 \quad (3)$$

and a lower limit of the surface energy of the surface of the plasma polymer layer is determined by a function (4):

$$\sigma = 0.25*E + 22.25 \quad (4)$$

with
σ=the surface energy [mN/m]
E=the modulus of elasticity [GPa].

22. The plasma polymer layer, as claimed in claim 2, wherein an upper limit of the surface energy of the surface is determined by a function (3):

$$\sigma = 0.9*E + 21.7 \quad (3)$$

and a lower limit of the surface energy of the surface is determined by a function (4):

$$\sigma = 0.25*E + 22.25 \quad (4)$$

with
σ=the surface energy [mN/m]
E=the modulus of elasticity [GPa].

23. The plasma polymer layer as claimed in claim 1, wherein the plasma polymer layer has a layer thickness of 200 nm-10 μm.

24. The plasma polymer layer as claimed in claim 1, wherein the plasma polymer layer has a layer thickness of 400 nm-5 μm.

25. The plasma polymer layer as claimed in claim 1, wherein a hardness of the plasma polymer layer as measured by means of nanoindentation is ≥1 GPa.

26. The plasma polymer layer as claimed in claim 1, wherein a hardness of the plasma polymer layer as measured by means of nanoindentation is ≥1.5 GPa.

27. The plasma polymer layer as claimed in claim 1,
wherein at the modulus of elasticity of ≥10 GPa and ≤20 GPa, maximum of the Si 2p peak on the surface of the plasma polymer layer as measured by means of XPS is between 102.7 eV-103.1 eV, and wherein at the modulus of elasticity of ≥20 GPa and ≤30 GPa on the surface of the plasma polymer layer as measured by means of XPS, the maximum of the Si 2p peak is >103.0 eV.

28. The plasma polymer layer as claimed in claim 1, wherein the plasma polymer layer consists to an extent of 90% entirely of the elements Carbon Oxygen, Silicon, and Hydrogen.

29. The plasma polymer layer as claimed in claim 1, wherein the plasma polymer layer consists to an extent of 90% entirely of the elements Carbon, Oxygen, Silicon, Hydrogen and Fluorine.

30. The plasma polymer layer as claimed in claim 1, wherein the plasma polymer layer has a lower polar component of the surface energy of the surface of <3 mN/m.

31. A plasma polymer layer for being disposed upon a solid body,
wherein a lower limit of a modulus of elasticity of the plasma polymer layer is determined by a following function (1):

$$E = 25 - 31.5*x + 13.5*x^2 - 1.85*x^3 \quad (1)$$

with
x=a C/O ratio determined by means of XPS,
E=the modulus of elasticity [GPa],
wherein the E or the modulus of elasticity is ≥1.25 GPa and ≤30.0 GPa and the x is ≥0.5 and ≤2.0; wherein at the E or the modulus of elasticity of ≥1.25 GPa and ≤10 GPa, a maximum of the Si 2p peak on a surface of the plasma polymer layer as measured by means of XPS is between 102.5-102.8 eV.

32. The plasma polymer layer as claimed in claim 31,
wherein at the E or the modulus of elasticity of ≥10 GPa and <20 GPa, the maximum of the Si 2p peak on the surface of the plasma polymer layer as measured by means of XPS is between 102.7-103.1 eV.

33. The plasma polymer layer as claimed in claim 31,
wherein at the E or the modulus of elasticity of ≥20 GPa and ≤30.0 GPa, the maximum of the Si 2p peak on the surface of the plasma polymer layer as measured by means of XPS is >103.0 eV.

34. The plasma polymer layer as claimed in claim 31, wherein a maximum polar component of a surface energy of the surface of the plasma polymer layer is determined by a function (2) or a function (2a):

$$\sigma(p) = 0.28*E + 0.106 \quad (2) \text{ or}$$

$$\sigma(p) = 1.2 \quad (2a),$$

whichever value of the function (2) and the function (2a) is greater,
with
σ(p)=a polar component of the surface energy [mN/m],
E=the modulus of elasticity [GPa],
wherein the E or the modulus of elasticity is ≥1.25 GPa and ≤30.0 GPa.

35. The plasma polymer layer as claimed in claim 31, wherein the surface of the plasma polymer layer has a refractive index at 550 nm of 1.4 to 1.54.

36. The plasma polymer layer as claimed in claim 31, wherein the plasma polymer layer has a thickness of 5 nm-20 μm.

37. The plasma polymer layer as claimed in claim 31, wherein a hardness of the plasma polymer layer as measured by means of nanoindentation is ≥0.5 GPa.

38. The plasma polymer layer as claimed in claim 31, wherein a molar ratio on the surface of the plasma polymer layer as measured by means of XPS is defined by at least one of:
O: Si 1.0-2.0, and
C: Si 1.1-2.5.

39. The plasma polymer layer as claimed in claim 31, wherein based on a total number of atoms present in the plasma polymer layer excluding H, a molar proportion on the surface of the plasma polymer layer measured by means of XPS is:
O: 25-50 at %,
Si: 22-28 at %, and
C: 28-50 at %.

40. The plasma polymer layer as claimed in claim 31, wherein the plasma polymer layer is disposed on the solid body in a mold as a separation layer.

41. The plasma polymer layer as claimed in claim 40, wherein the solid body is a fiber composite plastic.

42. The plasma polymer layer as claimed in claim 41, wherein the fiber composite plastic is selected from the group consisting of an elastomer, a thermoplastic and a thermoset.

43. The plasma polymer layer as claimed in claim 31, wherein an upper limit of a surface energy of the surface of the plasma polymer layer is determined by a function (3):

$$\sigma = 0.9*E + 21.7 \quad (3)$$

and a lower limit of the surface energy of the surface of the plasma polymer layer is determined by a function (4):

$$\sigma = 0.25*E + 22.25 \quad (4)$$

with
σ=the surface energy [mN/m]
E=the modulus of elasticity [GPa].

44. The plasma polymer layer, as claimed in claim 32, wherein an upper limit of the surface energy of the surface is determined by a function (3):

$$\sigma = 0.9*E + 21.7 \quad (3)$$

and a lower limit of the surface energy of the surface is determined by a function (4):

$$\sigma = 0.25*E + 22.25 \quad (4)$$

with
σ=the surface energy [mN/m]
E=the modulus of elasticity [GPa].

45. The plasma polymer layer as claimed in claim 31, wherein the plasma polymer layer has a layer thickness of 200 nm-10 μm.

46. The plasma polymer layer as claimed in claim 31, wherein the plasma polymer layer has a layer thickness of 400 nm-5 μm.

47. The plasma polymer layer as claimed in claim 31, wherein a hardness of the plasma polymer layer as measured by means of nanoindentation is ≥1 GPa.

48. The plasma polymer layer as claimed in claim 31, wherein a hardness of the plasma polymer layer as measured by means of nanoindentation is ≥1.5 GPa.

49. The plasma polymer layer as claimed in claim 31, wherein the plasma polymer layer consists to an extent of 90% entirely of the elements Carbon, Oxygen, Silicon, and Hydrogen.

50. The plasma polymer layer as claimed in claim 31, wherein the plasma polymer layer consists to an extent of 90% entirely of the elements Carbon, Oxygen, Silicon, Hydrogen and Fluorine.

51. The plasma polymer layer as claimed in claim 31, wherein the plasma polymer layer has a lower polar component of the surface energy of the surface of ≤3 mN/m.

* * * * *

UNITED STATES PATENT AND TRADEMARK OFFICE
CERTIFICATE OF CORRECTION

PATENT NO. : 11,286,392 B2
APPLICATION NO. : 15/024742
DATED : March 29, 2022
INVENTOR(S) : Vissing et al.

It is certified that error appears in the above-identified patent and that said Letters Patent is hereby corrected as shown below:

In the Claims

Claim 21, Line 42:
Delete "$\alpha$=the surface energy [mN/m]" and replace with "$\sigma$=the surface energy [mN/m]".

Claim 27, Lines 6-9:
Delete "wherein at the modulus of elasticity of $\geq$20 GPa and $\leq$30 GPa on the surface of the plasma polymer layer as measured by means of XPS, the maximum of the Si 2p peak is >103.0 eV" and replace with "wherein at the modulus of elasticity of >20 GPa and $\leq$30 GPa on the surface of the plasma polymer layer as measured by means of XPS, the maximum of the Si 2p peak is >103.0 eV".

Signed and Sealed this
Twentieth Day of September, 2022

Katherine Kelly Vidal
*Director of the United States Patent and Trademark Office*